US009031251B2

(12) United States Patent
Alcock

(10) Patent No.: US 9,031,251 B2
(45) Date of Patent: May 12, 2015

(54) DIGITAL NOISE-CANCELLATION

(75) Inventor: Robert Alcock, Thame (GB)

(73) Assignee: Incus Laboratories Limited, Buckinghamshire (GB)

( * ) Notice: Subject to any disclaimer, the term of this patent is extended or adjusted under 35 U.S.C. 154(b) by 289 days.

(21) Appl. No.: 13/550,112

(22) Filed: Jul. 16, 2012

(65) Prior Publication Data

US 2013/0022213 A1 Jan. 24, 2013

(30) Foreign Application Priority Data

Jul. 18, 2011 (GB) .................................. 1112342.9

(51) Int. Cl.

*G10K 11/16* (2006.01)
*H03B 29/00* (2006.01)
*G10K 11/178* (2006.01)
*H04R 1/10* (2006.01)

(52) U.S. Cl.

CPC ................ *G10K 11/178* (2013.01); *H04R 1/10* (2013.01); *G10K 11/1782* (2013.01); *G10K 2210/3011* (2013.01); *G10K 2210/3028* (2013.01); *G10K 2210/3051* (2013.01)

(58) Field of Classification Search

CPC .................... G10K 2210/30; G10K 2210/301; G10K 2210/3012
USPC ........................................................ 381/71.6
See application file for complete search history.

(56) References Cited

U.S. PATENT DOCUMENTS 5,852,667 A * 12/1998 Pan et al. ..................... 381/71.1
2009/0046867 A1* 2/2009 Clemow ....................... 381/71.6

FOREIGN PATENT DOCUMENTS

EP 1921601 A2 5/2008
EP 1970901 A2 9/2008
GB 2465064 A 5/2010

OTHER PUBLICATIONS

UK Intellectual Property Office, Search Report for GB1112342.9, Oct. 25, 2011.

* cited by examiner

*Primary Examiner* — Ping Lee
(74) *Attorney, Agent, or Firm* — Paul D. Bianco; Martin Fleit; Fleit Gibbons Gutman Bongini & Bianco PL

(57) ABSTRACT

This invention relates to a device for and method of implementing an ambient noise-cancellation (ANC) circuit that uses digital processing whereby a signal indicative of the ambient noise is converted to digital form, filtered, using a fixed or adaptive digital filter, and then converted back to analog before sending it to an ear-proximate speaker. In order to address the time delays associated with such processing operations, the analog-to-digital converter used is associated with a down-sampler, and the arrangement is such that a first part of the filtering is implemented by the down-sampler, and a second part of the filtering is implemented by the digital filter. This reduces group delay by configuring a down-sampler associated with the front end of the analog-to-digital converter to incorporate selected filter characteristics of the overall ANC filter response, and modifying the subsequent filtering processing stage to compensate for this.

7 Claims, 5 Drawing Sheets

DIGITAL NOISE-CANCELLATION

CROSS REFERENCE TO RELATED APPLICATIONS

This application claims priority to United Kingdom patent application No. GB 1112342.9 filed Jul. 18, 2011, the entire contents of which are herein incorporated by reference.

FIELD OF THE INVENTION

The present invention relates to a device for and method of implementing an ambient noise-cancellation (ANC) circuit that uses digital processing. The device utilises a traditional signal-processing components, incorporating analogue-to-digital conversion and digital filtering to implement the desired noise-cancellation frequency response, followed by digital-to-analogue conversion.

BACKGROUND OF THE INVENTION

It will be appreciated that ANC is a term of art, and its use herein is not intended to imply that perfect cancellation of ambient noise is achieved; merely that the levels of ambient noise as perceived by a listener can be substantially reduced by the use of ANC systems.

ANC enables the perceived loudness of the noise surrounding a user to be reduced by creating a signal that, when played through a speaker proximal to the ear of the user, produces an acoustical output that interferes destructively at the user's eardrum with the noise surrounding the user. The signal that is played through the speaker is usually created by deriving a signal representative of the ambient noise using a microphone proximal to the ear of the user and applying a filter to that signal.

In order for the system to be effective, the amplitude and phase of the filter must be correct simultaneously. A related requirement for destructive interference is that the generated signal that is played through the speaker must arrive at the user's eardrum at the same time as the ambient noise signal that was detected by the microphone and thus gave rise to the generated signal. For this to occur, the generated signal must be constructed within the time it takes for the ambient noise wave-front to propagate a distance equivalent to the distance from the sensing microphone to the speaker proximal to the ear of the user. For a typical sized circumaural noise-cancellation headphone this distance is typically about 15 mm, corresponding to a time delay of approximately 44 μs. This has specific consequences when digital processing is used because of the inherent time-delays in the analogue-to-digital and digital-to-analogue converters (briefly "ADC" and "DAC" respectively) and clocked digital signal-processing apparatus.

There is a large body of prior-art which describes digital noise-cancellation circuits. Examples include GB-A-2149614 in which the fundamental frequencies and harmonics of the ambient noise are identified and a microprocessor is used to generate an anti-noise signal; U.S. Pat. No. 6,278,786 which describes a feedback noise-cancellation system in a headset, for use in an aircraft, incorporating a hybrid analogue and digital apparatus, and a publication: "The implementation of digital filters using a modified Widrow-Hoff algorithm for the adaptive cancellation of acoustic noise" (Acoustics, Speech, and Signal-processing, IEEE International Conference on ICASSP '84, March 1984, pp. 215-218) which describes a noise-cancellation system using and "electronic controller" implementing a digital filter.

The generic steps in the signal-processing for the prior-art involve converting a signal indicative of the ambient noise to a digital form using an analogue-to-digital converter, applying a fixed filter or an adaptive filter to the digital signal, then converting the result back to analogue using a digital-to-analogue converter before sending it to a speaker located near the ear of the listener.

The most significant practical difficulty associated with using a digital processing system in a low-cost and low-power active noise-cancellation application is the selection of the ADC and DAC, because commercially available low-cost, low-noise, audio-bandwidth components tend to have a group delay in the region of 50 μs to 100 μs, i.e. in excess of the 44 μs or so needed for the present application. Examples include Analog Devices AD1974, Texas Instruments PCM3002 and Cirrus Logic CS42526.

One obvious method of decreasing the time delay incurred by the digital processing is to increase the rate at which the analogue input is sampled. This can be achieved using a high performance ADC, DAC and digital processor, but it has the disadvantage of increased cost and significantly increased electrical power consumption. This latter issue assumes particular significance when it is noted that most ANC devices are hosted by battery-powered appliances.

ADCs and DACs that use a sigma-delta modulator have been the preferred choice for audio applications over the last two decades because they can achieve very high signal resolution using a low-cost complementary metal-oxide semiconductor (CMOS) manufacturing process. Sigma-delta modulation is based on the technique of oversampling the input analogue signal, combined with noise-shaping to reduce the noise in the band of interest. The output of a sigma-delta modulator is typically a stream of N-bit digital values at a sample-rate R, where N is often 1 and usually lower than 8, and where R is often 64 times the Nyquist frequency of the input analogue signal. Audio-bandwidth sigma-delta ADCs apply additional processing to the sigma-delta bit stream to increase its precision and decrease the sample-rate.

The precision of the bit stream is increased by averaging, usually by applying a low-pass filter. A second processing step is to reduce the sample-rate using a decimator. The low-pass filter and the decimator are usually designed together as a down-sampler, where the low-pass filter is used to attenuate frequencies which would otherwise cause aliasing artefacts. Unfortunately the low-pass filter introduces a time delay which is undesirable in a digital noise-cancellation apparatus.

Much of the prior-art uses low-cost sigma-delta analogue-to-digital converters. An example of prior-art is described in "Microprocessors and Microsystems" Volume 22 (7), 25 Jan. 1999, pp. 413-422, in which an Analog Devices AD1847 sigma-delta ADC and an Analog Devices ADSP2181 fixed point DSP are used, where the author implements an adaptive FIR filter with 100 taps.

One approach to time-delay reduction is described in US-A-2009/0046867, which suggests that the time delay in a traditional sigma-delta ADC can be reduced by dispensing with the down-sampler that is traditionally found in these components, and processing the immediate output of the sigma-delta modulator. The drawback with this is that the digital processor that carries out the ANC filtering must operate at a very high sample-rate, and consequently the power consumption is high. In contrast to this, it is estimated that the power consumption of the present invention would be 75% less than that particular method.

It is an object of the present invention to provide an economical ANC device with reasonable power consumption and a processing time delay that is concomitant with an ability to efficiently implement ambient noise reduction.

SUMMARY OF THE INVENTION

According to the invention from one aspect there is provided a noise-cancellation device for filtering electrical signals representing ambient noise, sensed as it proceeds towards a listener's ear, to generate further electrical signals and means for transducing said further electrical signals into a modified acoustic signal intended to destructively interfere with said sensed ambient noise when it arrives at said ear; the device comprising analogue-to-digital conversion means for converting said electrical signals to digital signals, a down-sampling means associated with said analogue-to-digital conversion means, and digital filtering means conditioned to output digital signals for conversion into analogue signals comprising said further electrical signals; wherein the device is configured such that a first part of said filtering is implemented by said down-sampling means and a second part of said filtering is implemented by said digital filtering means.

In preferred embodiments of the invention, said analogue-to-digital conversion means includes a sigma-delta analogue-to-digital converter.

In some preferred embodiments of the invention, said analogue-to-digital conversion means is associated with a digital microphone means.

Another objective of the present invention is to provide a device capable of processing the output of a sigma-delta modulator to economically produce a high precision, low sample-rate signal without incurring an unwanted time delay.

This embodiment of the invention reduces group delay by configuring a down-sampler that is associated with the front end of the ADC to incorporate selected filter characteristics of the overall ANC filter response, and modifying the subsequent filtering processing stage to compensate for this.

Thus, the lower sample-rate is derived without introducing a significant unwanted time delay that is characteristic of the down-samplers that are used in traditional sigma-delta converters. As a result, such embodiments of the invention provide the benefits of low-cost and low latency (from the high input sample-rate of the sigma-delta modulator) and reduced power consumption, because of the lower sample-rate used for the subsequent digital processing.

Preferably, the overall filtering function comprises a gross low-pass filter characteristic within the frequency response, together with a non-flat pass-band.

In such circumstances, it is preferred that the down-sampling means is configured to implement the gross low-pass filter characteristic and the digital filtering means is configured to implement the non-flat pass band.

The invention also encompasses electronic appliances or equipment hosting devices as aforesaid.

According to another aspect of the invention, there is provided a method of generating acoustic noise cancellation signals intended to interfere destructively with ambient noise at a listener's ear; the method comprising the steps of: detecting said ambient noise and generating digital input electrical signals indicative thereof; down-sampling the digital signals; further processing the digital signals to generate modified digital signals; converting said modified digital signals into analogue electrical output signals; and transducing said electrical output signals to generate said acoustic noise cancellation signals; wherein the method further comprises configuring the steps of down-sampling and further processing to each perform respective parts of a digital filtering operation intended to create said destructive interference between said noise cancellation signals and said ambient noise.

BRIEF DESCRIPTION OF THE DRAWINGS

In order that the invention may be clearly understood and readily carried into effect, one embodiment thereof will now be described, by way of example only, with reference to the accompanying drawings of which.

DETAILED DESCRIPTION OF THE INVENTION

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically.

Figure 1:
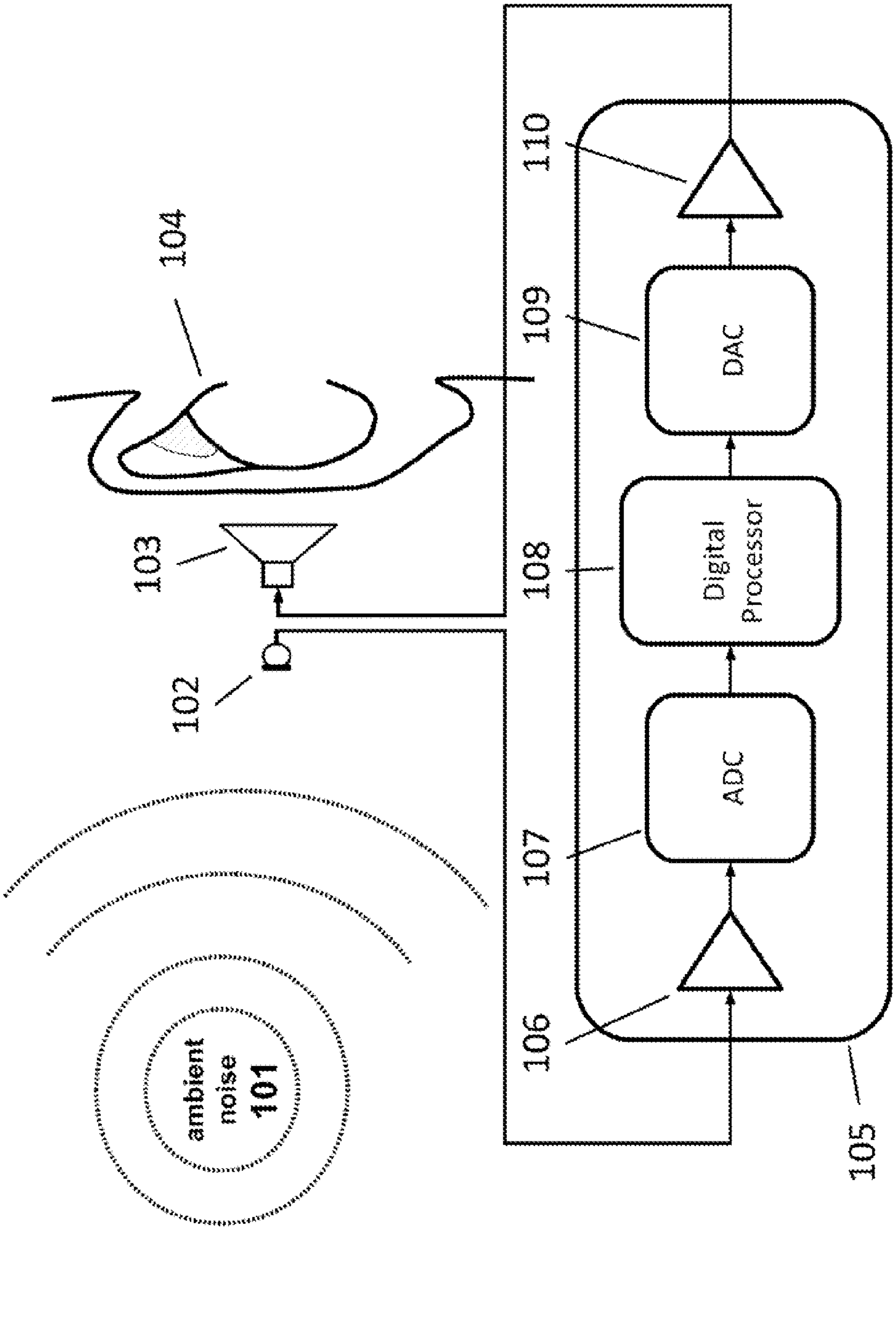
FIG. 1 shows, in diagrammatic form, a generic digital ambient noise-cancellation system that is representative of prior-art.

A generic digital ambient noise-cancellation apparatus is shown in FIG. 1. The acoustical waveform generated by an ambient noise 101 is detected by a microphone 102. The electrical signal created by the microphone is passed into a noise-cancellation apparatus 105 which produces a modified electrical signal which is fed into a speaker 103. The microphone 102 and the speaker 103 are proximal to the ear of the user 104. The noise cancelling apparatus 105 is designed so that the compensating acoustical signal (i.e. that leaving the speaker 103 having been detected by the microphone, subjected to conversion from analogue to digital, digital processing and conversion from digital to analogue) interferes destructively at the ear-drum of the user with the original acoustical signal (the "parent" signal that was detected by the microphone and used to create the compensating signal), as the parent signal itself eventually reaches the ear-drum directly from the ambient noise 101.

The ambient noise-cancellation apparatus 105 consists of an analogue amplifier 106, an analogue-to-digital converter 107, a digital processor means 108, a digital-to-analogue converter 109 and an analogue amplifier 110. This arrangement is typical of the prior-art, and it will be appreciated that the overall, general nature of the processor means is to produce a compensating acoustic signal which is, in effect an inversion of the original (parent) acoustic signal used to create it and which is applied to the ear-proximal loudspeaker for reproduction in time for acoustic combination, with the correct phase and amplitude, with the original (parent) acoustic signal itself as it arrives at the eardrum of the user.

Figure 2:
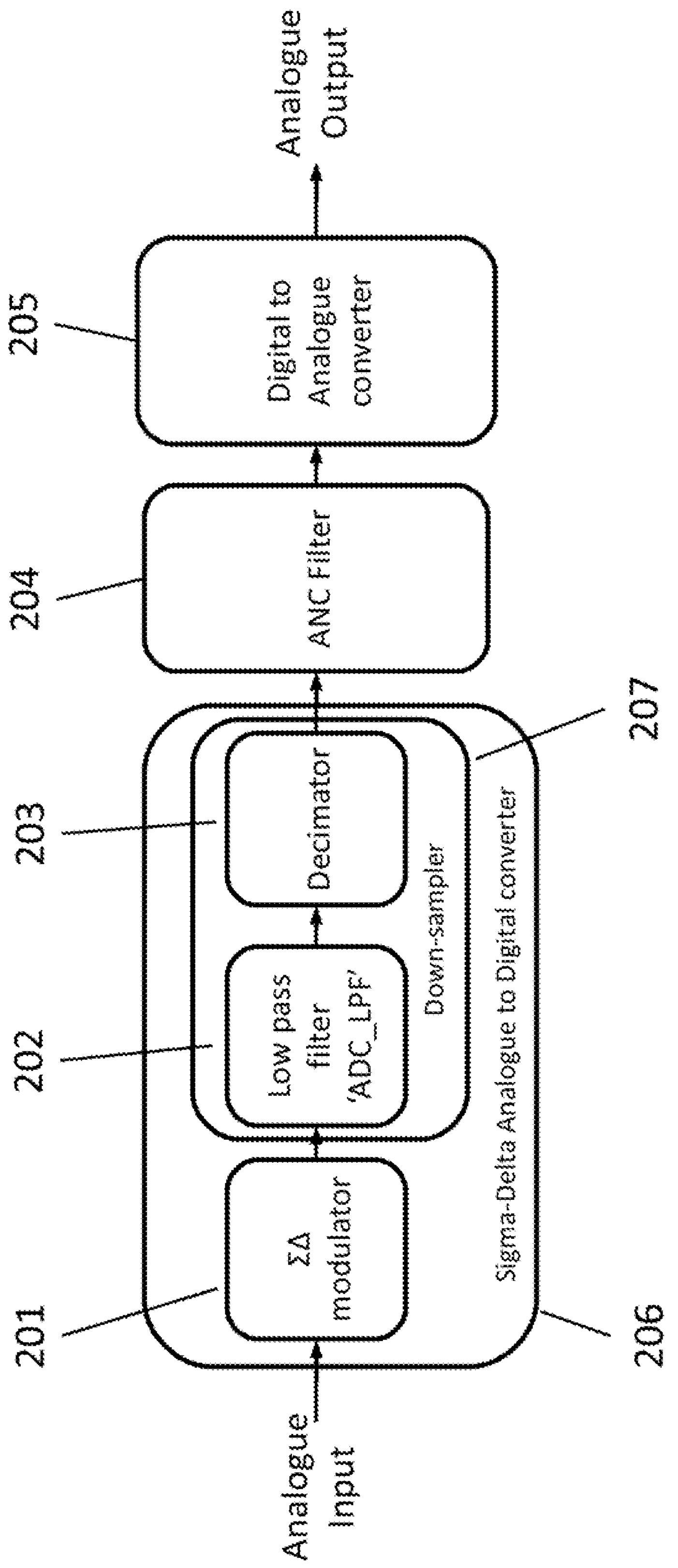
FIG. 2 shows, in block diagrammatic form, a traditional digital processing system using a sigma-delta analogue-to-digital converter that applies a filter, suitable for noise-cancellation applications, to an input analogue signal.

FIG. 2 shows a specific implementation of part of the digital noise-cancellation apparatus which has a sigma-delta analogue-to-digital converter 206. The most pertinent components of the sigma-delta analogue-to-digital converter 206, for present purposes, are a sigma-delta modulator 201 and a down-sampler 207. The down-sampler decreases the sample-rate of the data produced by the sigma-delta modulator and increases the precision of the data. The down-sampler 207 is composed of a low-pass filter 202 and a decimator 203. The architecture of the sigma-delta converter is typical of the prior-art.

Figure 3:
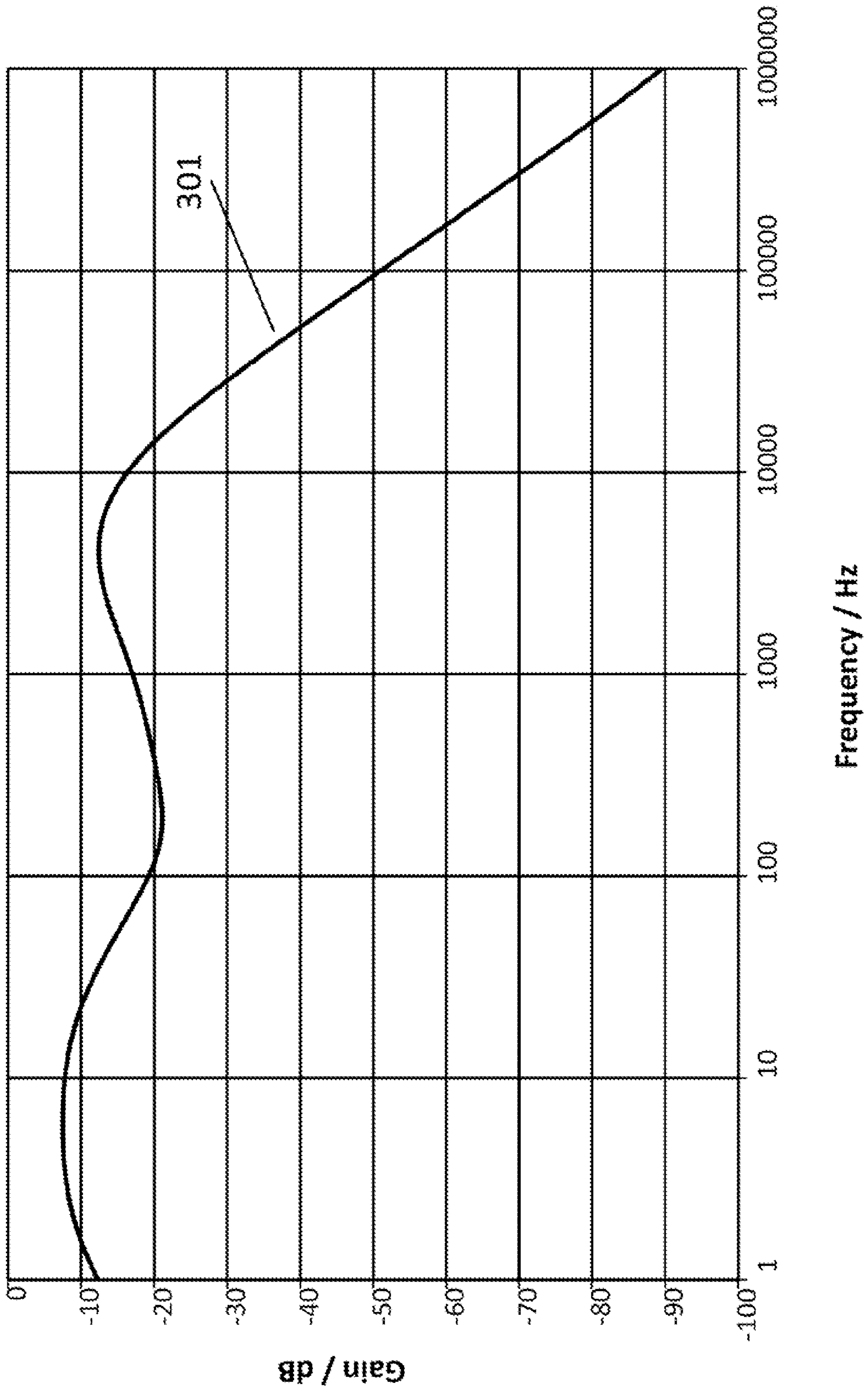
FIG. 3 shows, the frequency response for a filter that is representative of the requirements for a noise-cancellation filter.

FIG. 3 shows a frequency response 301 for a filter that is typical of the processing performed by the ANC Filter 204. By inspection, it is clear that there is a gross low-pass filter characteristic within the frequency response, together with a non-flat pass-band.

Figure 4:
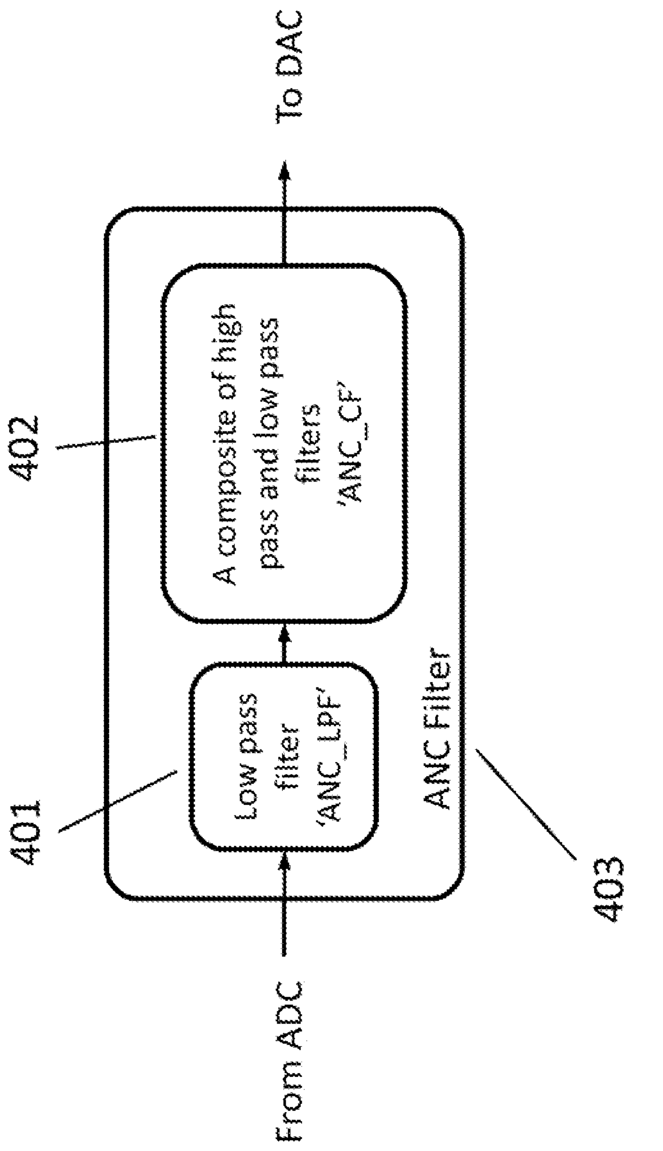
FIG. 4 shows, in block diagrammatic form, one form of digital filter architecture capable of implementing a noise-cancellation filter.

One example of an architectural implementation for a filter that can implement the frequency response 301 is shown in FIG. 4. It consists of a low-pass filter 401 that implements the gross low-pass filter characteristic of 301, followed by a composite filter 402 that implements the detail in the pass band of the filter characteristic 301. The details of the low-pass filter have to be carefully crafted in order to maintain the correct amplitude and phase response of the combined filter 403.

One aim of the present invention is to reduce the overall time delay in the digital processing apparatus by effectively reducing the unwanted group delay in the down-sampler 207. This is achieved by transferring the properties of the gross low-pass filter from the ANC filter block 401 into the down-sampler in the sigma-delta analogue-to-digital converter.

Figure 5:
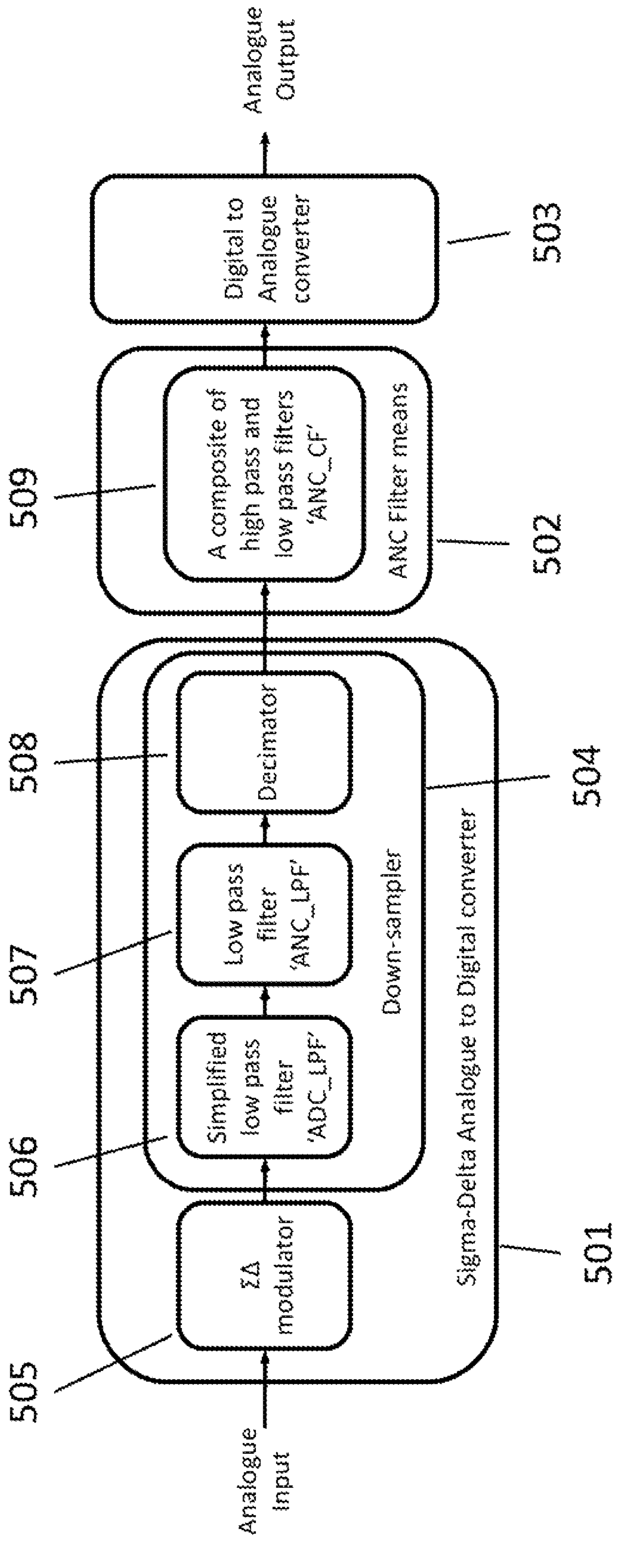
FIG. 5 shows, in block diagrammatic form and by way of example only, one embodiment of the present invention, using a sigma-delta analogue-to-digital converter that exhibits low latency.

FIG. 5 shows a signal-processing path representative of one implementation of the present invention. It shows the digital components of a noise-cancellation apparatus consisting of the traditional blocks of a sigma-delta converter 501, a digital ANC filter means 502 and a digital-to-analogue converter 503. In this implementation, however, (unlike a traditional system) the down-sampler 504, which directly processes the output of the sigma-delta modulator 505, is composed of a filter 507, whose properties are derived from the frequency response of the noise-cancellation filter 301, and a simplified low-pass filter 506. By incorporating filter 507 into the down-sampler of the sigma-delta converter, the requirements for the low-pass filter 506 are substantially reduced, such that a relatively uncomplicated filter can be used. Consequently, the group delay for filter 506 is substantially smaller than the group delay for the equivalent filter 202 in a traditional sigma-delta converter.

It may be preferred in some embodiments of the invention to implement the down-sampler 504 in two or more stages. For example, in a first step the sample-rate at the output of the sigma-delta modulator 505 can be filtered by a low-pass filter ‘A’ and decimated by a fixed factor ‘B’. A second step can then apply a low-pass filter ‘C’ and decimate by a factor of ‘D’. The combination of the low-pass filters ‘A’ and ‘C’ is equivalent to the product of filters 506 and 507, and the combination of the decimators ‘B’ and ‘D’ is equivalent to decimator 508.

It will be appreciated that devices in accordance with the present invention can be incorporated into various host equipment, including (without limitation) headphones, earphones or the like, control pods therefor, cell phones, and personal audio devices, such as MP3 players, and the invention encompasses any host equipment incorporating such devices.

In an alternative embodiment of the invention, a digital microphone is used to detect the ambient noise. Typically, the digital microphone produces an oversampled modulated signal that is substantially equivalent to that of the sigma-delta modulator 505 described with reference to FIG. 5. The output of the digital microphone can thus be processed by a down-sampler means such as that shown at 504 in FIG. 5, with part of the overall filtering characteristic being imposed by the down-sampler 504 and the other part by the ANC filter means 502.

It will be appreciated by persons skilled in the art that the present disclosure is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the disclosure.

All references cited herein are expressly incorporated by reference in their entirety. In addition, unless mention was made above to the contrary, it should be noted that all of the accompanying drawings are not to scale. There are many different features to the present disclosure and it is contemplated that these features may be used together or separately. Thus, the disclosure should not be limited to any particular combination of features or to a particular application of the disclosure. Further, it should be understood that variations and modifications within the spirit and scope of the disclosure might occur to those skilled in the art to which the disclosure pertains. Accordingly, all expedient modifications readily attainable by one versed in the art from the disclosure set forth herein that are within the scope and spirit of the present disclosure are to be included as further embodiments of the present disclosure.

The invention claimed is:

1. A noise-cancellation device for applying an ambient noise-cancellation (ANC) filter response to electrical signals representing ambient noise, sensed as said ambient noise proceeds toward a listener's ear, to generate further electrical signals and means for transducing said further electrical signals into a modified acoustic signal intended to destructively interfere with said sensed ambient noise when said sensed ambient noise arrives at said ear; the ANC filter response having a gross low-pass filter characteristic and a non-flat pass-band; the device comprising analogue-to-digital conversion means for converting said electrical signals to digital signals, a down-sampling means associated with said analogue-to-digital conversion means and including a gross low-pass filter and a simplified low-pass filter, the down-sampling means configured to implement the gross low-pass filter characteristic, wherein a group delay of the simplified low-pass filter is significantly smaller than a combined group delay of the gross low-pass filter and the simplified low-pass filter, and digital filtering means conditioned to output digital signals for conversion into analogue signals comprising said further electrical signals, the digital filtering means configured to implement the non-flat pass-band; wherein the device is configured such that a first part of said ANC filter response is implemented by said down-sampling means and a second part of said filtering is implemented by said digital filtering means.

2. The device according to claim 1, wherein said analogue-to-digital conversion means includes a sigma-delta analogue-to-digital converter.

3. The device according to claim 2, wherein said analogue-to-digital conversion means is associated with a digital microphone means.

4. The device according to claim 1, wherein said analogue-to-digital conversion means is associated with a digital microphone means.

5. Equipment for hosting the device according to claim 1.

6. A method of generating acoustic noise cancellation signals intended to interfere destructively with ambient noise at a listener's ear, the method utilizing the device according to claim 1 and comprising the steps of:

- detecting said ambient noise and generating digital input electrical signals indicative thereof;
- down-sampling the digital signals;
- further processing the digital signals to generate modified digital signals;
- converting said modified digital signals into analogue electrical output signals; and
- transducing said electrical output signals to generate said acoustic noise cancellation signals, wherein the method further comprises configuring the step of down-sampling to perform on the digital signals a first part of an ANC filter response and configuring the step of further processing to perform on the digital signals a second, remaining part of said ANC filter response, said ANC filter response intended to create said destructive interference between said noise cancellation signals and said ambient noise.

7. A noise-cancellation device for applying an ambient noise-cancellation (ANC) filter response to electrical signals representing ambient noise, sensed as said ambient noise proceeds toward a listener's ear, to generate further electrical signals and means for transducing said further electrical signals into a modified acoustic signal intended to destructively interfere with said sensed ambient noise when said sensed ambient noise arrives at said ear; the ANC filter response having a gross low-pass filter characteristic and a non-flat pass-band; the device comprising analogue-to-digital conversion means for converting said electrical signals to digital signals, a down-sampling means associated with said analogue-to-digital conversion means and including a gross low-pass filter and a simplified low-pass filter, the gross low-pass filter implementing the gross low-pass filter characteristic of the ANC filter response, the down-sampling means configured to implement the gross low-pass filter characteristic, wherein a group delay of the simplified low-pass filter is significantly smaller than a conventional antialiasing filter implementing substantially the same attenuation performance as the combined gross low-pass filter and the simplified low-pass filter, and digital filtering means conditioned to output digital signals for conversion into analogue signals comprising said further electrical signals, the digital filtering means configured to implement the non-flat pass-band; wherein the device is configured such that a first part of said ANC filter response is implemented by said down-sampling means and a second part of said filtering is implemented by said digital filtering means.

* * * * *